US007159969B2

(12) United States Patent
Conta et al.

(10) Patent No.: US 7,159,969 B2
(45) Date of Patent: Jan. 9, 2007

(54) COMPOSITE INK JET PRINTHEAD AND RELATIVE MANUFACTURING PROCESS

(75) Inventors: Renato Conta, Ivrea (IT); Enrico Manini, Chiaverano (IT)

(73) Assignee: Telecom Italia S.p.A., Milan (IT)

( * ) Notice: Subject to any disclaimer, the term of this patent is extended or adjusted under 35 U.S.C. 154(b) by 203 days.

(21) Appl. No.: 10/504,870

(22) PCT Filed: Feb. 20, 2003

(86) PCT No.: PCT/IT03/00099

§ 371 (c)(1),
(2), (4) Date: Aug. 17, 2004

(87) PCT Pub. No.: WO03/070471

PCT Pub. Date: Aug. 28, 2003

(65) Prior Publication Data

US 2005/0104936 A1 May 19, 2005

(30) Foreign Application Priority Data

Feb. 20, 2002 (IT) .......................... TO2002A0144

(51) Int. Cl.

| | |
|---|---|
| ***B41J 2/05*** | (2006.01) |
| ***B41J 2/145*** | (2006.01) |
| ***B41J 2/21*** | (2006.01) |
| ***C03C 25/68*** | (2006.01) |
| ***H01L 21/00*** | (2006.01) |
| ***H01L 21/301*** | (2006.01) |
| ***B21D 53/00*** | (2006.01) |

(52) U.S. Cl. ............................ 347/65; 347/40; 347/43; 216/27; 216/33; 29/890.1

(58) Field of Classification Search .................. 347/40, 347/43, 65
See application file for complete search history.

(56) References Cited

U.S. PATENT DOCUMENTS 5,565,900 A * 10/1996 Cowger et al. ............... 347/42
5,818,482 A * 10/1998 Ohta et al. ..................... 347/70
5,900,894 A 5/1999 Masahiko et al.

FOREIGN PATENT DOCUMENTS

EP 0 659 573 6/1995
EP 0 666 174 8/1995
EP 0970812 A1 * 12/2000

* cited by examiner

*Primary Examiner*—Lamson Nguyen
*Assistant Examiner*—Lisa M. Solomon
(74) *Attorney, Agent, or Firm*—Venable LLP; Robert Kinberg; Steven J. Schwarz

(57) ABSTRACT

The composite printhead (1) is made up of an active module (7), consisting of a thin plate (8) of silicon, on which a plurality of chambers (14) is produced, housing corresponding heating resistors (10), electrically connected through an interconnection network to corresponding external contact pads (37, 42), and of a support element (3) for the active module, in turn consisting of a portion of plate (22) of a rigid, insulating material, provided with an elongated slot shape, ink feeding duct (5), traversing the thickness of the support element (3). The active module (7) is built separately from the support element (3) and later mounted integrally upon the support element (3). Also mounted later to the support (3) is a frame (16) surrounding the active module (7) to provide hydraulic sealing. Finally the module (7) and the frame (16) are covered with a metallic or resin lamina (17), bearing an array of nozzles (18) aligned with and facing the ejection chambers (14).

23 Claims, 5 Drawing Sheets

COMPOSITE INK JET PRINTHEAD AND RELATIVE MANUFACTURING PROCESS

This is a U.S. National Phase Application Under 35 USC 371 and applicant herewith claims the benefit of priority of PCT/IT03/00099 filed on Feb. 20, 2003, which was published Under PCT Article 21(2) in English, and of Application No. TO2002A000144 filed in Italy on Feb. 20, 2002. The contents of the applications are incorporated by reference herein.

TECHNICAL FIELD

This invention relates to a composite ink jet printhead and to the printhead manufacturing process, particularly for a "top-shooter" type ink jet printhead, i.e. the type in which the droplets of ink are ejected perpendicularly to the substrate containing the heating elements and the ejection chambers.

BRIEF DESCRIPTION OF THE STATE OF THE ART

As is known in the art, for instance from the Italian patent No. 1234800 and from the U.S. Pat. No. 5,387,314, printheads of the type mentioned above are made using as the support a thin wafer of crystalline silicon approx. 0.6 mm. thick and with a diameter of approx. 150 mm., from which the single heads will be separated after they have been manufactured, while a plurality of overlapping layers is deposited on the silicon disc with known vacuum processes. Produced on these layers are the NMOS active devices for each head, made using integrated circuit technology, the heating elements, or resistors, and the relative electrical connections to the outside, protected and separated by corresponding isolating layers; the resistors are housed inside chambers built into the thickness of a further overlapping layer of photosensitive material, for example VACREL™, and obtained in a photolithographic process together with the lateral ink feeding channels; the channels of the chambers communicate with a narrow, oblong ink feeding duct, in the shape of a slot, which crosses through the silicon support and the layers already deposited and is arranged between two parallel rows of chambers, disposed on both long sides of the slots.

Before being separated, each of the heads still on the wafer has a metallic or plastic lamina, bearing the ejection nozzles, applied to it and attached by gluing on top of the layer of the chambers, and positioned precisely so that each nozzle coincides with a corresponding chamber.

The wafer thus completed is cut according to a rectangular mesh grid to separate the single heads, each of which is completed by being connected to a flat cable, the ends of which are soldered to corresponding contact pads made along an edge of each single head and connected by way of internal connections to the resistors.

In the current art, machining of the slots is performed after the active semiconductor devices have been made, and the layers of the resistors, the layer of the relative electrical connections and the protection layers above have been deposited on the silicon wafer. The two-step machining work starts on the surface opposite that bearing the resistors with a partial sand-blasting process, or chemical etching process on the silicon wafer and is completed with an erosion performed by sand blasting, or with a laser beam. Alternatively the slots can be made in a single, total sand blasting operation.

Machining of the slots in the ways mentioned above often results in geometrical irregularities, or an offsetting of the edge of the slots with respect to the resistors, or even damage to the layers that are crossed through, on account of splintering on the edge of the slot facing the chambers, with a resultant high level of production rejects, specially for slots that are long (>½") and narrow (<250 μm), in addition to being a lengthy, complex and expensive process.

SUMMARY DESCRIPTION OF THE INVENTION

The main object of this invention consists in producing printheads without the drawbacks mentioned above and in particular in producing the printheads in lesser time and at lower cost with respect to the known art, and in which the machining of the ink feeding ducts (slots) does not interfere with the integrity of the layers in the area of the resistors and of the ejection chambers and channels leading to the chambers.

A further object of the invention consists in manufacturing ink jet printheads in which the extent of the surface of the silicon wafer used by the printhead is reduced to the minimum.

A further object of the invention is that of defining an innovative process for manufacturing ink jet printheads, in which machining of the ink feeding ducts does not interfere with the integrity of the resistors and of the relative protective layers and in which each head is made using a silicon wafer of very low dimensions, to increase the printhead production yield and permit the production of multiple colour heads, namely with various independent groups of nozzles, capable of ejecting very small droplets (<5 pl), particularly suitable for the printing of images of photographic resolution.

In accordance with the predefined objects, according to this invention, a composite, ink jet printhead and innovative head manufacturing process are presented, characterized in the way defined in the corresponding main claims.

This and other characteristics of the invention will appear more clearly from the following description of a preferred embodiment of the printhead and of its manufacturing process, provided by way of non-restrictive example, with reference to the figures of the accompanying drawings.

DETAILED DESCRIPTION OF THE INVENTION

Figure 1:
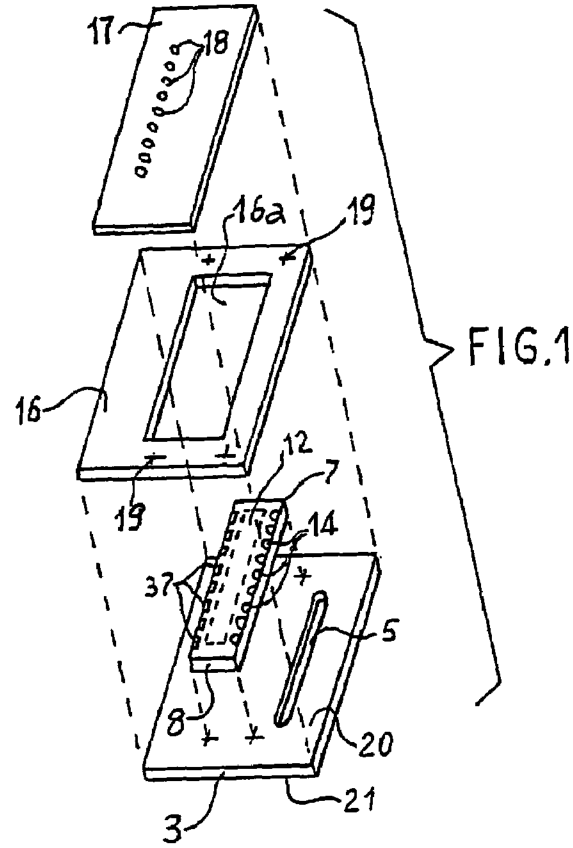
FIG. 1 represents an expanded perspective view of a composite, ink jet printhead, made according to this invention.

The fundamental idea, at the basis of the solution provided by this invention, is that of making an ink jet printhead 1 (FIG. 1), substantially comprising two parts machined separately and assembled together only at the end of the respective machining processes; more in particular the new composite printhead is made up of a first support element, or base 3, of a rigid and isolating material; a slot-shaped aperture 5 is made on the base 3, going right through the thickness of the base itself. This aperture constitutes the ink feeding duct, as will be described in detail later.

A second element, called active module 7, consists of a plate of crystalline silicon 8, upon which, with processes known in the art and separately from the base 3, the NMOS active devices are made. These constitute the driving and selecting circuits 12. Layers are then deposited of heating elements, or resistors 10, and of relative interconnections, followed by a photosensitive resin film 15, in which the ink ejection chambers 14, aligned with the corresponding resistors 10, are made.

At this point, each active module 7 is fastened on a pre-prepared corresponding base 3, by means of gluing and pressing. Subsequently a frame 16 of resin having the same thickness as the module 7 and surrounding the module, is glued on the base 3 to improve hydraulic sealing.

Finally each active module 7 is completed with the application on the photosensitive film 15 and partially above the frame 16, of a metallic or plastic lamina 17 bearing the ejection nozzles 18, disposed with precision in correspondence with the chambers 14 and facing the respective resistors 10, in such a way that the ink droplets are ejected in a direction perpendicular to the plane of extension of the resistors 10 (top shooter).

A more detailed description will follow of the structure and the manufacturing process of a non-restrictive, preferred embodiment of a composite printhead, according to the invention, and in particular of a head with a single line of nozzles.

It remains understood that the solution idea set forth in this invention is also applicable to so-called multiple heads, having more than one active module and different geometries.

Preparation of the Base 3

The head 1, as already anticipated with reference to FIG. 1, comprises a support element, or base 3, substantially rectangular in shape, of thickness between 400 and 600 μm and delimited by two flat and parallel opposite surfaces 20 and 21; the base 3 is cut from a plate 22 (FIG. 4) of rigid, electrically isolating, chemically inert material, with coefficient of thermal dilatation close to that of the crystalline silicon. Among the materials that may be used to produce the base 3, by way of non-restrictive examples, the following may be quoted: alumina, borosilicate glass, resin, or even crystalline silicon, not necessarily of prime purity and surface finishing.

As an example, the choice for use in production of the bases 3 falls on a plate 22 (FIG. 4) of ordinary, commercial type silicon, without any particular electrical and mechanical characteristics, having diameter approx. 150 mm. and thickness approx. 400–600 μm, from which approximately 500 unitary bases may be obtained after machining, assuming that each base has dimensions of approx. 5×14 mm.

Figure 4:
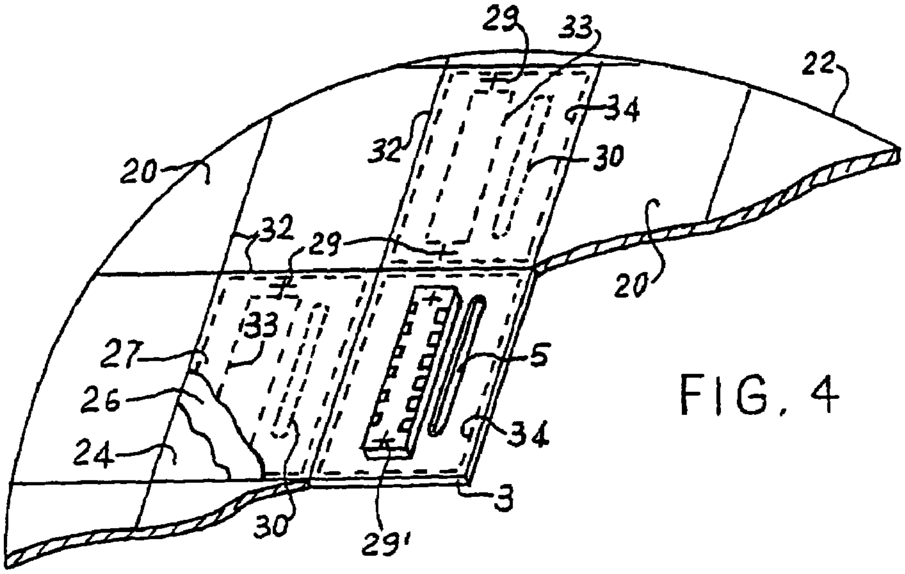
FIG. 4 represents the disposition of the support elements, or bases, on a support plate before they are cut and separated.

The preparation of the bases 3 proceeds according to the following steps (FIG. 4).

Step 1) on a face 20 of the plate 22, a metallic film 24, for example Al or Cr, of thickness 1000–3000 A°, is deposited, and on this is applied a layer of photosensitive material (photoresist) 26, in turn exposed with a mask for defining the following positioning references:

1*a*) reference and alignment marks 29, for high precision positioning, that is to say with a tolerance of +/−1 μm of the active module 7 on its base 3;

1*b*) outline 30 of the slot 5;

1*c*) separation lines 32, along which the single support bases 3 will subsequently be cut;

1*d*) outlines of areas 33 of dispensation of the adhesives, for gluing the active module 7 on the base 3;

1*e*) outline of the area of dispensation 34 of the adhesive for gluing the resin frame 16, which laterally seals the module 7 on its base 3.

Step 2) exposure of the photoresist 26 to a light source through a mask and subsequent development; removal of the superfluous portions of the metallic film 24, not protected by the mask used.

Step 3) deposition of an “adhesion promotion” type film to facilitate adhesion of the glues.

Step 4) etching of the slot 5, without particular restrictions of precision, since there are no delicate components, such as resistors, or NMOS circuits on the base 3. The etching may be performed with one of methods known in the art, such as sand blasting, laser beam, vacuum plasma, anisotropic chemical etching, etc. Where alumina, or ceramic, is used, the slot is obtained by pressing before to baking.

Production of the slots 5 concludes preparation of the bases 3, which are provisionally deposited in a temporary store.

Preparation of the Active Modules 7.

To produce the active modules 7 a crystalline silicon disc or wafer is used. Not depicted in any of the drawings, the wafer is between 400 and 600 μm thick; initially, both the outer, opposite surfaces are passivated with an isolating layer of silicon oxide, $SiO_2$; supposing that each active module 7 has plan dimensions of 10.5 mm×1.6 mm, roughly 700 silicon wafers may be made, without considering the inevitable production rejects.

Then on one of the passivated surfaces, using the known semiconductor technologies, for each active module 7, the NMOS circuits for driving the resistors 10, the logic circuits for selecting are made, and the resistors 10, the protective layers, the internal interconnections and the external contact pads are produced with a deposition of conducting, isolating and resistive layers; finally a layer of photosensitive polymer is laminated, in which, following exposure and development, the ink ejection chambers are built, according to the manufacturing processes known in the art, for instance as described in detail in the above-mentioned Italian patent No. 1.234.800, or in the Italian patent application No. TO 2001 A001019 filed in the name of the applicant, which are recalled for reference.

Figure 5:
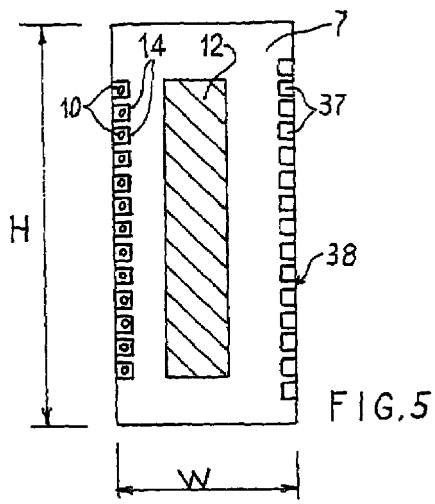
FIGS. 5 and 6 illustrate disposition of the contact pads on two active modules of different types.
Figure 6:
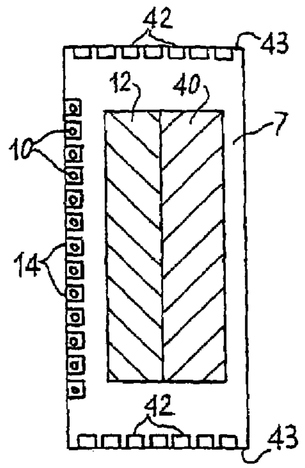

Following the preparation process described, according to the invention, at least two types of active modules may be produced by way of non-restrictive example:

a first type called “Module A” (FIG. 5), in which the driving circuit 12, integrated in the module, is laid out as an NMOS matrix, which requires a large number of external connections, or contact pads 37, arranged on the long side 38 opposite the resistors 10;

a second type called “Module B” (FIG. 6) which, as well as the driving circuit 12, also integrates on board the CMOS or NMOS selection logic 40, with a further reduction in the number of contact pads 42 for external connection, which can be disposed on the short sides 43 of the module 7.

Once construction of all the active modules contained in the silicon disc has been completed, after the customary sight and electrical test inspections, the single modules are separated by cutting of the disc according to a rectangular grid of dimensions in line with the dimensions of the single modules.

Production of the Composite Printhead

Figure 2:
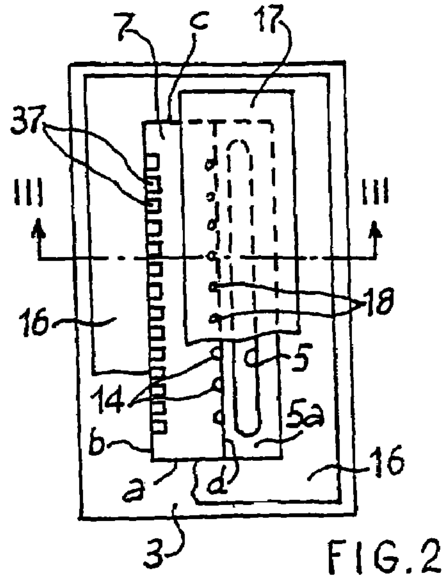
FIG. 2 represents a partially sectioned plan view of the printhead of FIG. 1.

Composition of the printhead according to the invention is completed with an operation of mounting of each of the active modules 7 on each of the bases 3 still joined on the plate 22, and is conducted in the following steps:

step 5) dispensation of an polymerizable adhesive in the areas 33 where the active modules 7 will be mounted on the plate 22;

step 6) positioning and alignment of the active modules with precision of +/−1 μm on the bases 3 of the plate 22, taking reference between the marks 29 of the base 3 and corresponding marks 29' made on each module 7;

step 7) application on the bases 3 of spots of UV ray hardened bonder to keep the single active modules in place during the subsequent phase of polymerization of the polymerizable adhesive;

step 8) polymerization of the polymerizable adhesive after completing the positioning and alignment of the individual active modules in the relative positions on the plate 22;

step 9) dispensation of adhesive in the areas 34 where the frames 16 are bonded;

step 10) assembly of the resin frames 16 on the bases 3, according to the references of the separation lines 32 of the plate 22; the frames 16 are made from a substantially rectangular shaped resin plate (FIG. 1), having a central aperture 16*a*, also rectangular in shape, complementary to the dimensions of the active module 7 and suitable for surrounding the active module 7, in contact with at least three contiguous sides "a", "b", "c" of the active module 7 (FIGS. 2, 3); the frame 16 is kept at a distance from the fourth side "d" of the active module 7, that is to say the fourth side "e" of the aperture 16*a* is disposed beyond the slot 5 with respect to the fourth side "d" of the active module 7, provided with chambers 14, so as to constitute an ink store chamber 5*a*, in communication both with the feeding slot 5 and with the ejection chambers 14; the frames 16 must be of the same thickness as the active modules 7 in order to form together with the active module 7, a uniform surface, that facilitates subsequent bonding of the nozzle-bearing lamina 17 (FIG. 1);

step 11) polymerization of the adhesive in order to block the frames on the plate 22;

step 12) application of an adhesive on the upper surface of the frames 16, for subsequent mounting of the laminas 17 bearing the ink-ejecting nozzles; the nozzle-bearing laminas 17 adhere to the layer 15 of photopolymer by thermal effect; alternatively a film of thermoplastic, or thermohardening material may be applied on the frame, deposited by tampography, rolling, silk screen printing, or more simply through a layer of semi-liquid bonding agent, dispensed flat in a groove, not represented in the drawings, prepared in the frames;

step 13) assembly of the nozzle-bearing lamina 17 and its temporary alignment with respect to the resistors 10 and fastening of said lamina with a number of spots of bonding agent 19, 86 (FIGS. 1, 13), before separation of the portion of nozzle-bearing lamina, relative to each single module, from the bearing reel, not depicted in the drawings, in the case of plastic laminas, or from the pre-engraved sheet, in the case of metallic laminas;

step 14) pressing at controlled temperature and duration of all the laminas 17 of all the active modules 7 assembled on the plate 22, for gluing of the laminas on the layer of photosensitive polymer 15 of each of the active modules 7 and on the frames 16; at the end of this operation, the nozzle-bearing laminas 17 constitute an upper closing wall of both the ejection chambers 14, and of the store chambers 5*a*, communicating with the slots 5;

step 15) cutting of the plate 22 along the separation lines 32 to produce the individual composite printheads.

Figure 7:
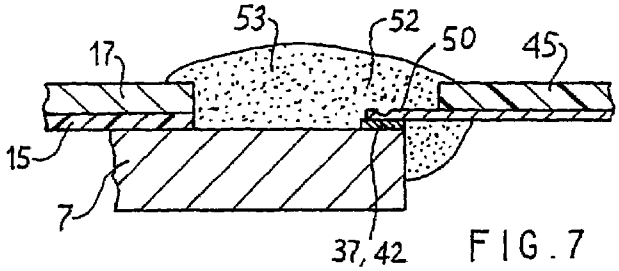
FIGS. 7 and 8 represent two different techniques for soldering the at cable to the contact pads of an active module.
Figure 8:
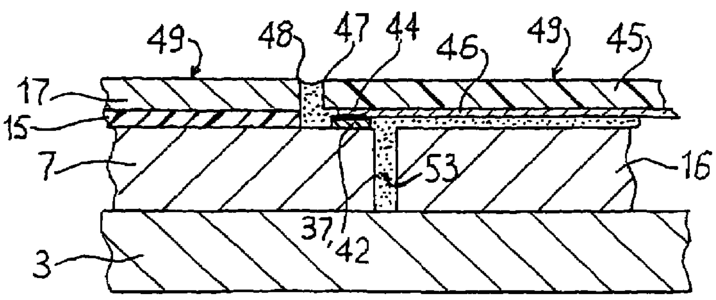

The composite heads thus produced have a flat cable 45 connected to them, through the soldering of its ends to the contact pads 37, 42, made on the edges of each active module 7; the soldering may be performed with the standard process, known in the sector art, called "Tape Automatic Bonding" or T.A.B. (FIG. 7), or with thermoplastic adhesives of the A.C.F. (Anisotropic Conductive Film) or A.C.P. (Anisotropic Conductive Paste) type (FIG. 8), made from a thermoplastic film 44, or respectively a paste resin to be dispensed, including small electrically conductive balls, dispersed through the polymer; the Tin-Bismuth alloy based conducting balls, with melting point approx. 140° C., produce an optimal electrical contact between the flat cable 45 and the contact pads 37,42 of the modules 7, such as for instance the commercially known product Loctite ACP 3445™.

The A.C.F. or A.C.P. technique comes with the advantage that the contact conductors 46 of the flat cable 45 (FIG. 8) are borne by the same flat cable, with the advantage that the header edge 47 of the flat cable may be placed very close to the edge 48 of the nozzle-bearing lamina 17 and the thickness of the flat cable can be chosen so that the upper surface 49 of the flat cable is on the same level as that 49' of the nozzle-bearing lamina 17; conversely, with T.A.B. (FIG. 7), the soldering ends 50 of the flat cable are arranged embossed, creating a cavity 52 which can be filled with a protective UV resin 53.

The A.C.F. or A.C.P. type connection is feasible with high definition heads; in fact, the ejected ink droplets may drop in volume to about 4–6 pl., with energies in play of 1–2 μJ, so that the electrical currents traversing the contact pads are in the order of 100 mA, or less.

The low level of consumed current means that the area occupied by the NMOS driving circuits (FIGS. 5, 6) may be reduced, with the resultant possibility of reducing the width "W" of the active module 7; this also allows the number of nozzles aligned in a single line to be increased inside a vast range, increasing the height "H" of the active module 7.

With a step of 1/300" between the resistors, that is to say between the nozzles, a module of height "H" up to 1" may be built, without encountering the problems of manufacturing the ink feeding slots 5, as these are made apart on the support plate 22.

The printhead preparation process described above is also suitable, without any particular amendments, for the preparation of multiple printheads, in which at least two, and possibly more active modules 7, are mounted on a single base, arranged in different configurations, according to the required level of printing performance.

Figure 9:
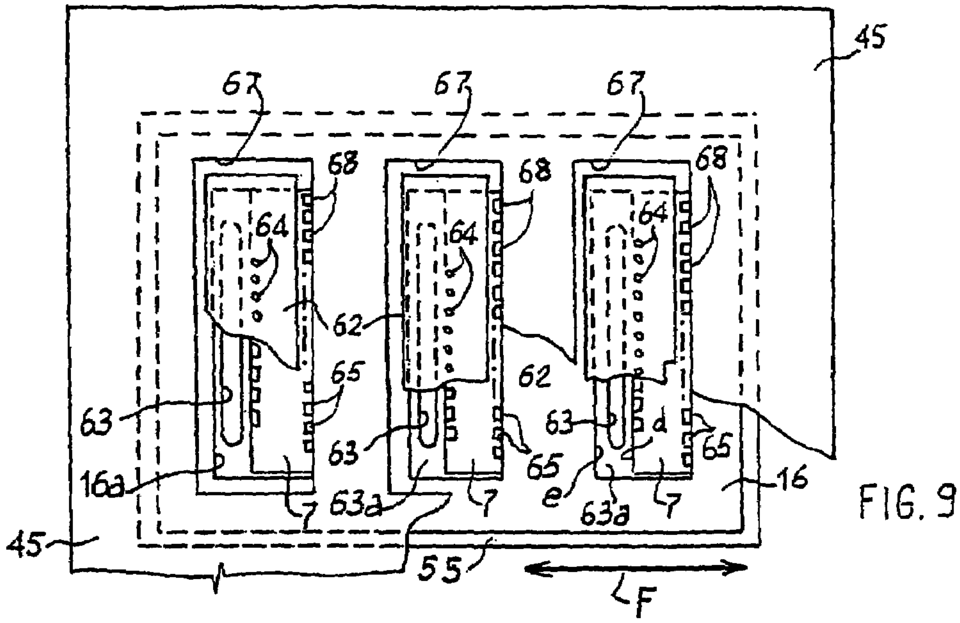
FIGS. 9 to 13 represent different geometries of composite ink jet printheads, according to the invention.

FIGS. 9 to 12 illustrate, by way of a non-restrictive example, a number of possible configurations of multiple printheads, consisting of a single base 55, on which a plurality of active modules 7, of type "A", is mounted, in which the electrical connection pads are arranged on a long side of each module 7, opposite the other long side, on which the ejection chambers 14 are arranged; more particularly, FIG. 9 represents a printhead in which, on a single base 55, three active, "A" type modules 7 for a colour printer are mounted.

Figure 3:
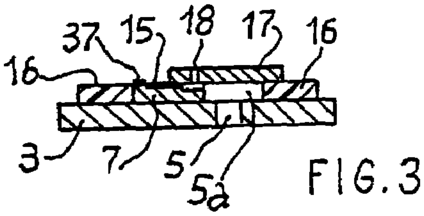
FIG. 3 is a section according to the line III—III in FIG. 2.

The modules 7 are set one beside the other, in parallel in the horizontal direction, i.e. parallel to the printing direction, indicated by the arrow "F", and with a pitch of the nozzles that gives a print resolution of 300, or 600 D.P.I.; designated with the numeral 60 is the outer edge of the support base 55, numeral 61 is that of the frame 16 on top, 62 the three nozzle-bearing laminas, designated with 63 are the three, different colour ink feeding slots; designated with 63*a* are the ink chambers, similar to those designated 5*a* in FIG. 3, delimited by the lamina 62, by the sides "e" of the aperture 16° and by the side "d" of the active modules 7.

The numeral 64 designates the nozzles aligned in the vicinity of the long side "d" of each module 7, facing the corresponding slot 63, and 65 the external connection pads to which the flat cable 45 is connected. In this version, the flat cable 45 is provided with three apertures 67 of a width that does not cover the nozzle-bearing laminas 62; the contact ends 68 of the flat cable 45 are disposed on a long internal side of each aperture 67.

Figure 10:
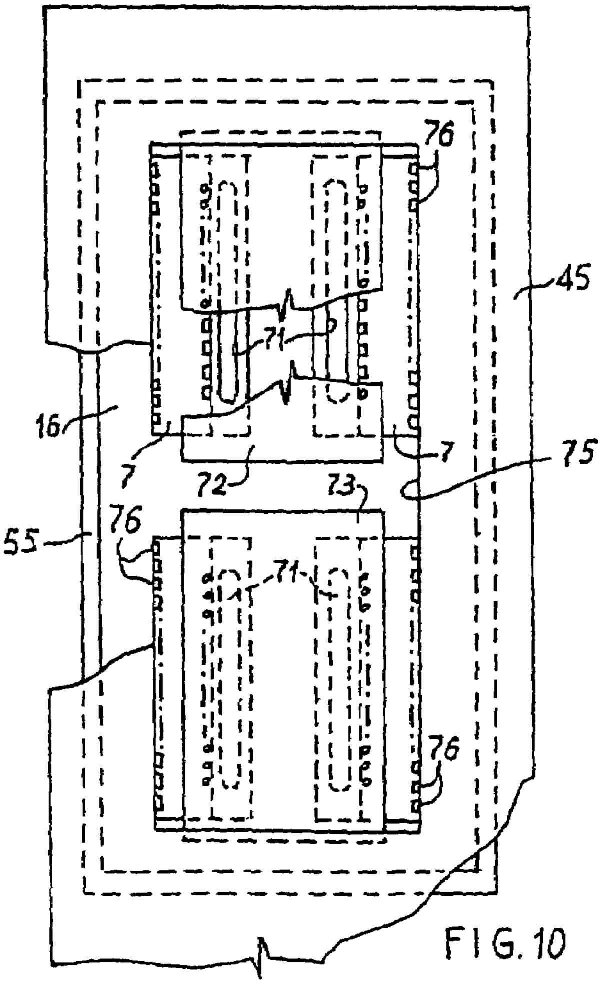

FIG. 10 depicts a printhead with four active modules 7 set side by side in two's, mounted on the same base 55, for printing with three colours plus black; the four feeding slots 71, each suitable for supplying a different colour ink, are produced on the base 55, machined separately from the active modules 7, and the four active modules 7, adjacent and parallel to each slot 71, are then mounted on the base 55.

In the version of FIG. 10, two nozzle-bearing laminas 72, 73 are used, each of which bears two parallel rows of nozzles 18 and two modules side by side.

The flat cable 45 is provided with a single rectangular aperture 75, and the connection pads 76 are situated on the two long sides of the aperture 75.

Figure 11:
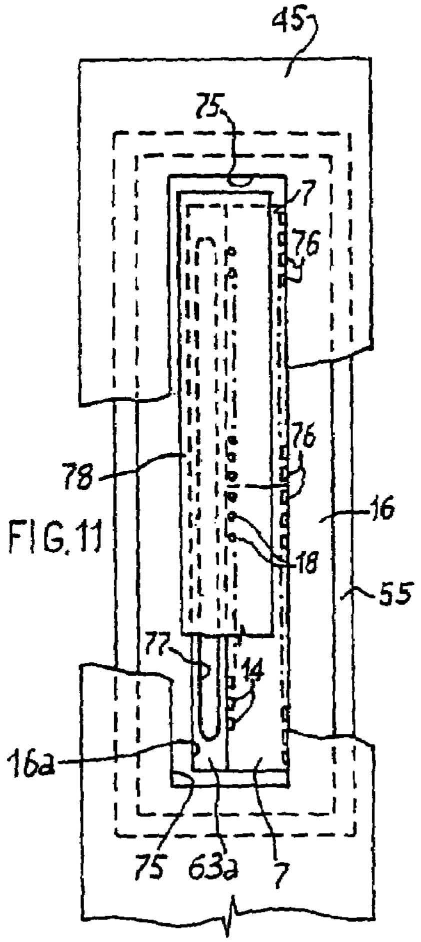

FIG. 11 shows a monocolour head consisting of a single base 55 on which are mounted two identical modules 7 aligned and touching head to head, with a pitch between the nozzles of 1/300"; this arrangement allows nozzle pitch to be kept constant, even when two modules are straddled. In this way, by using two modules with height (H) ½", a module of "equivalent" height 1" is obtained, with which to perform printing with a resolution of 300 D.P.I. with a single pass, or of 600 D.P.I. in two passes.

A single ink feeding slot 77 is made on the base 55. It is longer than other similar ones because it has to feed two consecutive rows of nozzles 18. Likewise the nozzle-bearing lamina 78 is made in a single piece and covers both the modules 7.

Figure 12:
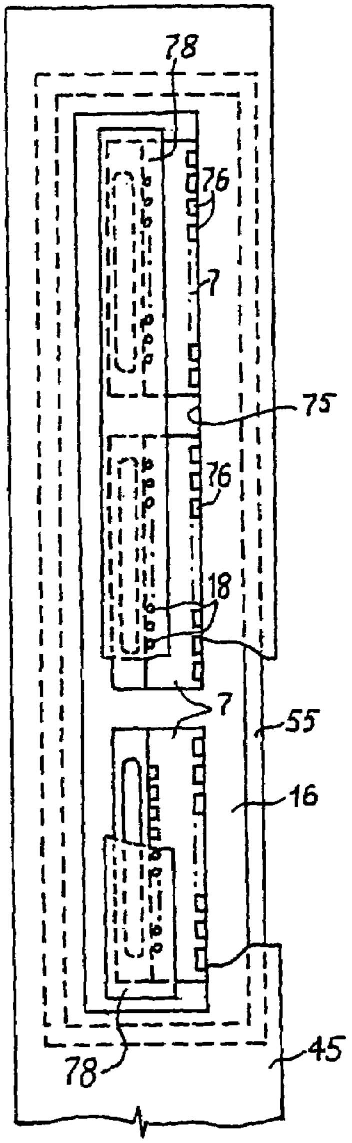

Finally, FIG. 12 illustrates a printhead made up of a single base 55, with three modules 7 aligned vertically, but each one separate from the other; this head may be used for printing in three colours at a pitch of 1/300", or 1/600".

Again in FIGS. 11, 12, the flat cable 45 has a single aperture 75 and the connection pads 76 are located on one of the long sides of the aperture 75.

Figure 13:
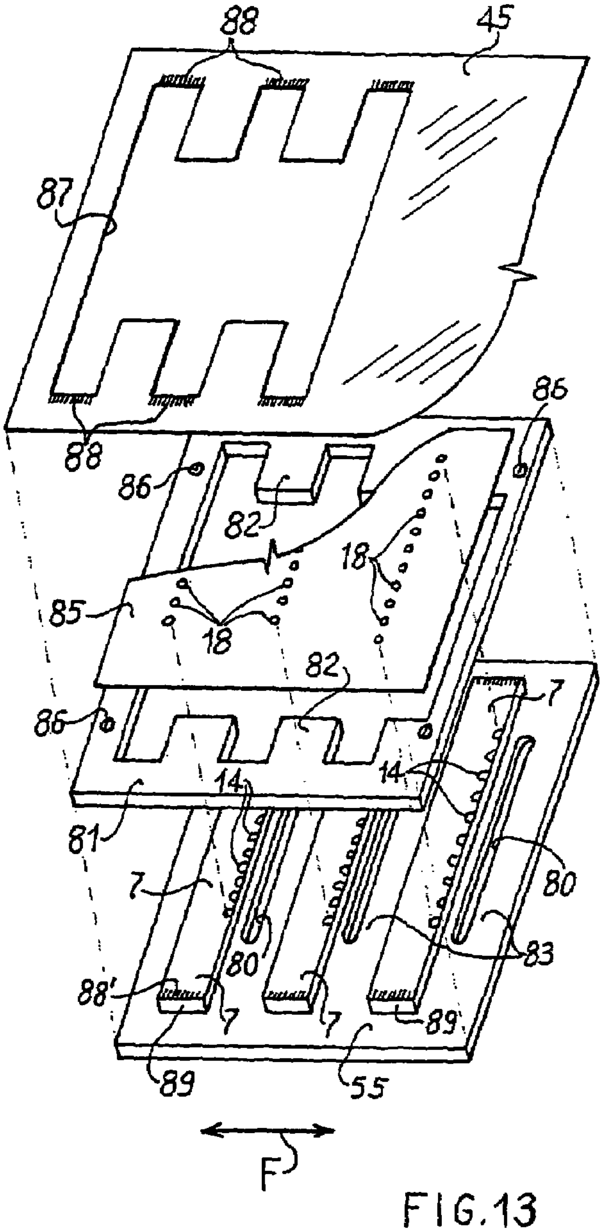

Depicted in an exploded, perspective view in FIG. 13 is a multiple, three-colour printhead, with three "B" type modules 7 on a single base 55, parallel and side by side in the direction of printing, indicated by the arrow "F". The base 55 is provided with three slots 80, in the vicinity of which the three active modules 7 are mounted.

A resin frame 81 of the same thickness as the modules 7 is glued on to the base 55, in such a way as to partially surround each module and thereby improve hydraulic sealing. The frame 81 is provided with opposing protrusions 82, of dimensions suitable for insertion between the modules 7, close to their ends 82, and for delimiting feeding chambers 83, communicating both with the corresponding slot 80 and with one of the groups of ejection chambers 14.

Glued to the frame 81 and to the three active modules 7 is a metallic or resin lamina 85, normally of Kapton™, provided with three parallel lines of nozzles 18. The nozzles 18 are set facing their corresponding resistors contained inside the chambers 14, so that the ink droplets are ejected in a direction perpendicular to the surface of the resistors themselves; the lamina 85 also constitutes the upper closing wall of the chambers 83.

During assembly of the heads on the plate 22 (FIG. 4), the laminas 85 are initially mounted on the frames 81 through a number of spots of UV binder 86, to keep them stationary and integral with the frame 81, before being separated from the reel, not shown in the drawings, on which they are wound, in the case or plastic laminas, or separated from a larger, pre-engraved sheet, in the case of metallic laminas. Finally the laminas 85 are glued by hot-pressing on the completed wafer.

The flat cable 45 has a single aperture 87, and the connection pads 88 of the flat cable 45 are connected to corresponding pads 88', made on the edge of the short sides 89 of the modules 7. With this geometry, even more than three modules may be used, for example four modules (three colours plus black), with obvious advantages, e.g. the nozzle-bearing lamina 85 may be made of a single piece, the head occupies less space on the horizontal, and the hydraulic sealing between the modules 7 and with the environment is more secure.

Figure 14:
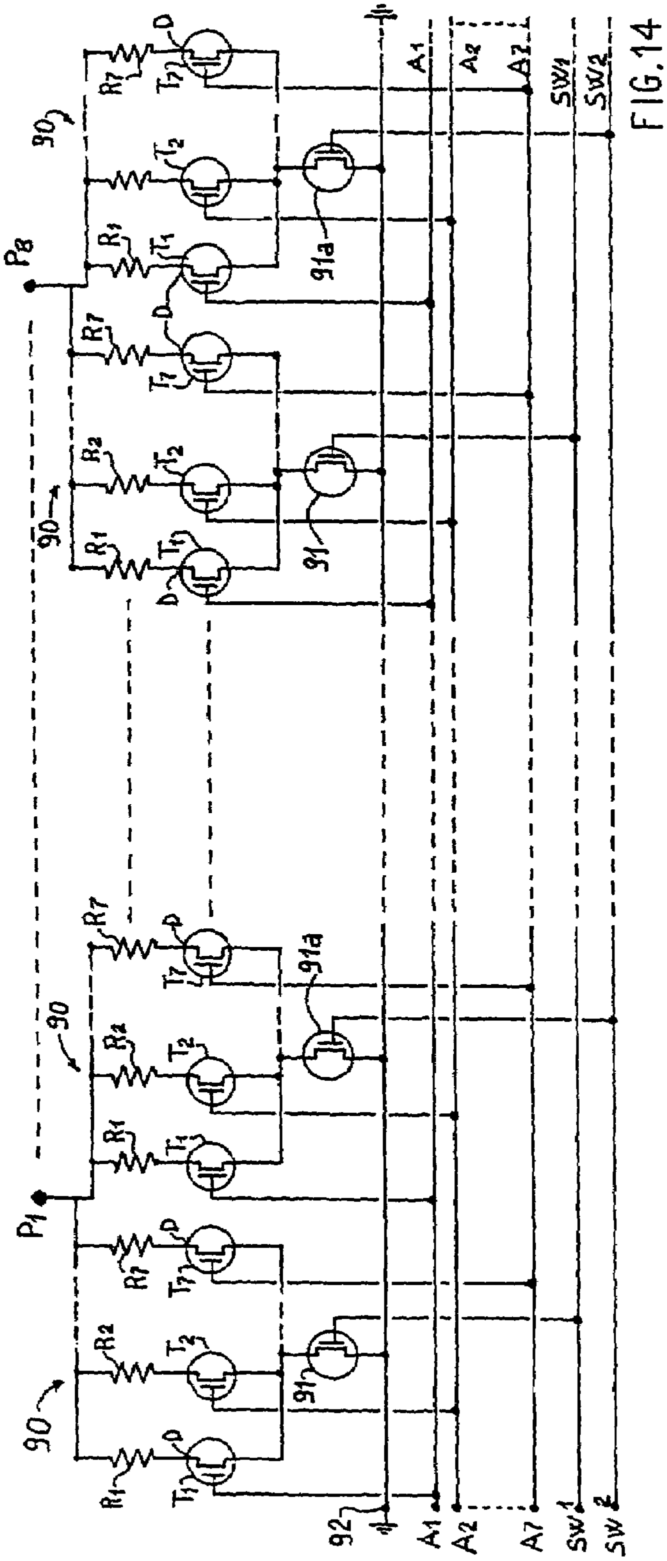
FIG. 14 represents the wiring diagram of an addressing circuit, integrated in an active module, according to the invention.

The configuration of the head depicted in FIG. 13, in which the flat cable 45 is soldered by its head to the active modules 7, namely on contact pads on the short sides 89 of the modules themselves, is rendered possible by the use of an addressing circuit operating in 3D mode, with simple N-MOS active devices, and in particular of the type described in the international patent application PCT/IT00/00271 with priority Dec. 7, 1999 filed by Olivetti Lexikon S.p.A., and illustrated in part in FIG. 14.

For simplicity of presentation and by way of example, it is supposed that each active module 7 of the head of FIG. 13 comprises 112 nozzles, to each of which corresponds a resistor $R_N$ (N=1 . . . 112), in turn activatable via a corresponding transistor $T_N$; the resistors $R_N$, and therefore the transistors $T_N$, are laid out in 8 pairs of groups 90 (FIG. 14) of seven resistors $R_1$, $R_2$, . . . $R_7$ each; the resistors $R_1$, $R_2$, . . . $R_7$ of each group 90 are connected between the "drain" D of each corresponding transistor $T_1$, $T_2$, . . . $T_7$ and in common to each primitive line $P_M$ (M=1 . . . 8); the transistors $T_1$, $T_2$, . . . $T_7$ of each group 90 have their "source" connected in common to the "drain" of a selector transistor 91, 91*a*, while each of their "gate" terminals is connected to one of the seven address lines $A_A$ (A=1 . . . 7); in turn the selector transistors 91, 91*a* have their "source" connected to a common ground terminal 92. The selector transistors 91 belonging to each first group and the selector transistors 91*a* belonging to each second group of each pair have their "gate" terminal connected to one or the other of two selection enabling lines, SW1 and SW2 respectively.

Therefore, with the pre-settings selected for the example described above, in which the number of primitives P=8, the number of addresses per primitive is A=7 and the number of selections SW=2, the following are required:

8 (P)+7 (A)+2 (SW)+2 (ground)=19 external contacts (pads) 88' for each active module 7, which is therefore provided with:

8 (P)*7 (A)*2 (SW)=112 resistors $R_N$, that is to say 112 ejection nozzles 18 (FIG. 13).

Figure 15:
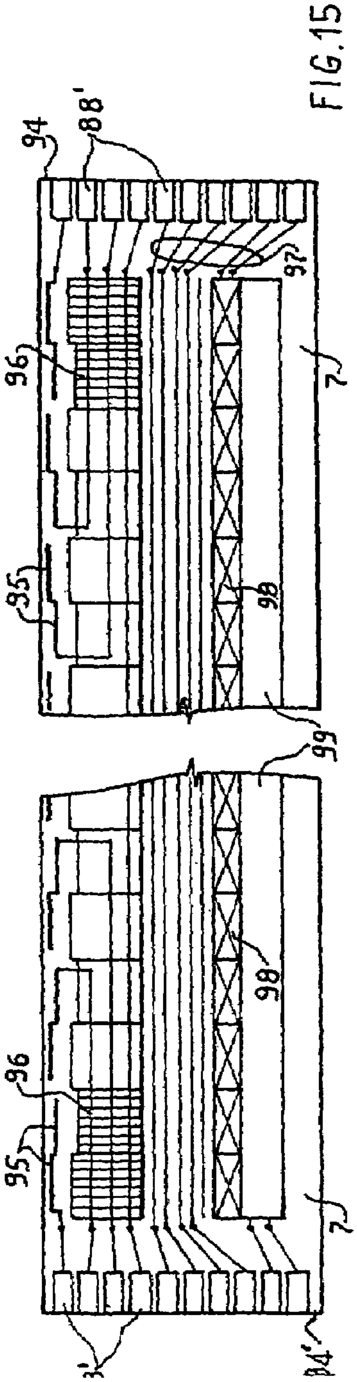
FIG. 15 schematically represents the disposition of the circuit of FIG. 14 on an active module.

FIG. 15 represents schematically an active module 7, built according to the pre-settings of the example presented. The plan dimensions of the active module 7 are length 10.5 mm and width 1.6 mm, i.e. the dimension of the short side 94.

The 19 pads 88' are subdivided (+one for back-up) ten per side 94, spaced apart by 20 μm, each pad having width 140 μm.

The circuit of FIG. 14 is represented schematically on the active module 7 of FIG. 15 in the following way:

the staggered lines 95 represent the sixteen groups of resistors $R_N$, each pair of groups being connected to a primitive line ($P_M$);

the squares 96 with vertical lines represent the transistors $T_N$ corresponding to each group of resistors $R_N$, which receive the address signals $A_A$ from an array 97 of conductors, which also includes two conductors for the pulses SW, which go to drive the selection transistors 91, represented by strike-through rectangles 98, below which runs a large ground return conductor 99.

The pads 88' on the short side 94' (on the left in FIG. 15) are therefore connected to the following conductors:

P1, P2, P3, P4; A1, A2, A3, A4; GRN;

whereas the pads 88' on the short side 94 (on the right in FIG. 15), are connected to the conductors:

P5, P6, P7, P8; A4, A5, A6, A7; SW1, SW2;

It is clear from the description that the composite printheads, produced according to the invention, have numerous advantages with respect to the heads of the prior art. Their construction is in fact simpler because, as the ink feeding slots are built separately, they do not have any of the precision and high quality finishing constraints required by the traditional construction techniques. Furthermore the new heads are also less expensive because the active modules may be built of lesser dimensions than in the previous techniques, saving considerable quantities of silicon and the noble metals used for the resistors and for the internal interconnections, and also the labour required for manufacture of each single chip.

A further advantage obtained with the heads according to the invention lies in the fact that, by using addressing circuits in 3D mode integrated in the active modules, the number of external connections is greatly reduced. This makes it possible to connect the conductors of the flat cable to contact pads, preferably arranged on the short sides of the active modules, so that a greater compacting can also be achieved of multiple printheads.

The invention claimed is:

1. Ink jet printhead comprising:

a plurality of nozzles and a corresponding plurality of heating elements, suitable for being selectively activated to produce the ejection of ink droplets through said nozzles, said nozzles being disposed facing the corresponding heating elements, the latter being housed in respective chambers suitable for containing ink, an active module made up of a thin wafer of silicon, bearing said plurality of heating elements and said respective chambers, said active module being also provided along its sides with a plurality of electrical contact pads connected to said heating elements and suitable for being soldered to an array of feeding wires, a support element for said active module, said support element consisting of a portion of a plate of rigid, isolating material, provided with a feeding duct for said ink, traversing the thickness of said support element, wherein said active module is machined while separate from said support element and subsequently mounted integrally and placed on said support element in such a way that said chambers are facing said feeding duct, a resin frame mounted on said support element and having the same thickness as said active module, said resin frame being provided with an aperture of a shape substantially complementary to the dimensions of said active module, suitable for accommodating said active module and also said feeding duct so at to define an ink store chamber communicating with the ejection chambers of said active module and with the corresponding feeding duct, and a lamina bearing said plurality nozzles, corresponding to said heating elements and to said chambers, said lamina being mounted in part above said frame and in part above said active module, but without covering the region of said electrical contact pads on said active module so as to allow soldering of them to said array of feeding wires, said lamina constituting also an upper closing wall for said chambers and for said communicating chamber.

2. Printhead according to claim 1, wherein said feeding duct is made in the form of a slot elongated in a longitudinal direction of said active module.

3. Printhead according to claim 1, wherein said aperture of said resin frame is suitable for accommodating said active module in contact along at least three contiguous sides of said aperture.

4. Printhead according to claim 3, wherein said feeding duct is arranged between a fourth side of said aperture and the chambers of the corresponding active module.

5. Printhead according to claim 1, wherein said active module comprises integrated electronic driving circuits, connected between said contact pads and said heating elements, suitable for selectively activating said heating elements, said contact pads being arranged on a long side of said active module, opposite said chambers.

6. Printhead according to claim 1, wherein said active module comprises integrated electronic driving and selecting circuits, suitable for selectively activating said heating elements and connected between said contact pads and said heating elements, said contact pads being arranged on both short sides of said active module.

7. Multiple ink jet printhead, comprising:

groups of nozzles and corresponding groups of heating elements, suitable for being selectively activated to produce ejection of the ink droplets through said groups of nozzles, the nozzles of each group being arranged facing the corresponding heating elements, the latter being accommodated in respective chambers suitable for containing ink, a plurality of active modules, each active module being made of a thin silicon plate bearing a corresponding group of heating elements and relative chambers, each of said active modules being also provided with a plurality of contact pads connected to said heating elements, a single support element for said plurality of active modules, said single support element being in turn made of a portion of a plate of rigid, isolating material and being provided with an ink feeding duct associated with each of said active modules, said feeding duct crossing through the thickness of said support element, wherein the active modules of said plurality are machined while separate from said single support element and subsequently integrally mounted on said single support element, and are positioned on it in such a way that the ejection chambers of each active module are facing the corresponding feeding duct, a resin frame mounted on said single support element and having the same thickness as said active modules, said resin frame being provided with at least one aperture having a substantially complementary shape to the dimensions of said active modules and being suitable for accommodating said active modules and the corresponding feeding duct, so as to define a plurality of ink store chambers, each communicating with the ejection chambers of a respective active module and with the corresponding feeding duct; and a lamina, bearing groups of nozzles associated with said ejection chambers, said lamina being mounted in part on top of at least one of said active modules and in part on top of said resin frame, but without covering the region of the contact pads on said at least one of said active modules, said lamina constituting also an upper closing wall for the communicating chamber and for the ejection chambers, facing said communicating chamber, corresponding to said at least one of said active modules.

8. Multiple printhead according to claim 7, wherein each aperture of said resin frame is suitable for accommodating a corresponding active module in contact along at least three contiguous sides of said each aperture.

9. Multiple printhead according to claim 8, wherein said each aperture of said resin frame accommodates, besides the corresponding active module, also the corresponding feeding duct, arranged between a fourth side of said each aperture and the chambers of the corresponding active module.

10. Multiple printhead according to claim 7, wherein said plurality of active modules comprises three active modules arranged side by side in parallel, in the horizontal direction, i.e. parallel to the printing direction, mounted on said single support element, the chambers of each active module facing a corresponding feeding duct of said single support element.

11. Multiple printhead according to claim 7, wherein said plurality of active modules comprises four active modules arranged side by side in two's, mounted on said single support element, for printing in three colours plus black, the chambers of each active module facing a corresponding feeding duct of said support element.

12. Multiple monocolour printhead according to claim 7, wherein said plurality of active modules comprises two identical active modules aligned and touching head to head, mounted on said single support element, for printing in a single colour, said support element comprising a single feeding duct, extending in a position facing the chambers of both of said two active modules, the chambers of said two active modules being separated by a constant step, said resin frame being provided with an aperture suitable for accommodating both said two active modules and said nozzle-bearing lamina being sized so as to cover both of said two active modules.

13. Multiple printhead according to claim 10, wherein each active module of said plurality comprises a group of pads arranged on a long side of said active modules, opposite said chambers.

14. Multiple printhead according to claim 13, wherein each active module of said plurality comprises integrated electronic driving circuits, suitable for selectively activating said heating elements and connected between said groups of pads and said heating elements.

15. Multiple printhead according to claim 7, wherein said plurality of active modules comprises at least three active modules arranged side by side in parallel, in a direction parallel to the printing direction, mounted on said single support element, the chambers of each active module facing a corresponding feeding duct of said support element, each active module of said plurality comprising integrated electronic driving circuits and integrated CMOS or NMOS logic selecting circuits, suitable for selectively activating a plurality of groups of heating elements and connected between groups of pads and said heating elements, said pads being arranged on short opposite sides of each active module.

16. Multiple printhead according to claim 15, wherein said CMOS or NMOS logic selecting circuits comprise a 3D mode addressing circuit, for selectively activating said heating elements, said addressing circuit comprising selection transistors associated with each of said groups of heating elements, suitable for activating in sequence predetermined heating elements, in each of said groups, defined by a pre-established combination between a selection address and a logic primitive signal, said selection transistors being enabled by a logic enabling signal.

17. Process for producing an ink jet printhead comprising a plurality of nozzles and a corresponding plurality of heating elements, suitable for being selectively activated to produce the expulsion of ink droplets through said nozzles, said nozzles being arranged facing corresponding heating elements, the latter being accommodated in respective chambers suitable for containing ink, said process comprising the following steps:

a) machining a plurality of active modules from a thin silicon plate, said plurality of active modules comprising said plurality of heating means and said chambers;

b) tracing on a surface of a plate of thin, rigid, electrically isolating material, reference marks and a grid of contour and separation lines for delimiting a plurality of support elements for said active modules, suitable for being cut from said plate;

c) making on each of said support elements, delimited by said contour lines, at least one aperture, passing through the thickness of said support element;

d) mounting on each of said support elements at least one of said active modules, with reference to said marks, in such a way that said plurality of chambers is facing each of said apertures;

e) mounting on each of said support elements a resin frame, provided with at least one aperture of a shape complementary to the dimensions of each of said active modules, suitable for accommodating a corresponding active module, and arranged adjacent to at least three contiguous sides of said active module and sized for defining an ink chamber arranged between a fourth side of said aperture and the chambers of said active module;

f) mounting on at least one of said active modules, or already mounted on the relative support element, of a lamina bearing a plurality of nozzles, corresponding to said plurality of chambers, in such a way that said nozzles are facing corresponding heating elements; and g) cutting said plate according to said contour lines for separating said support elements bearing at least one of said active modules, said frames and a corresponding nozzle-bearing lamina, wherein said step a occurs prior to said step d.

18. Process according to claim 17, wherein said step b also includes tracing on said surface of said plate the contour of said aperture and the contours of areas of dispensation of adhesive for mounting said active modules on said plate.

19. Process according to claim 17, wherein said step c also includes making said longitudinally elongated slot shape apertures of said active modules, following said traced contour.

20. Process according to claim 17, wherein said step d is preceded by the operation of applying an adhesive inside said areas dispensation.

21. Process according to claim 17, wherein said step e is preceded by the operation of applying an adhesive inside an area of dispensation surrounding said active modules, for gluing said frame.

22. Process according to claim 17, wherein said step f also includes said lamina being positioned in part on top of said at least one active module, and in part on top of said frame, and the mounting being performed by pressing at a controlled temperature and for a controlled duration.

23. An ink jet print head made by the process of claim 17.

* * * * *